(12) United States Patent
Xiu et al.

(10) Patent No.: US 8,916,981 B2
(45) Date of Patent: Dec. 23, 2014

(54) EPOXY-AMINE UNDERFILL MATERIALS FOR SEMICONDUCTOR PACKAGES

(71) Applicants: Yonghao Xiu, Chandler, AZ (US); Yiqun Bai, Chandler, AZ (US); Nisha Ananthakrishnan, Chandler, AZ (US); Nachiket R. Raravikar, Gilbert, AZ (US)

(72) Inventors: Yonghao Xiu, Chandler, AZ (US); Yiqun Bai, Chandler, AZ (US); Nisha Ananthakrishnan, Chandler, AZ (US); Nachiket R. Raravikar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/891,475

(22) Filed: May 10, 2013

(65) Prior Publication Data

US 2014/0332966 A1 Nov. 13, 2014

(51) Int. Cl.
*H01L 23/29* (2006.01)
*H01L 25/00* (2006.01)

(52) U.S. Cl.
CPC .............. *H01L 23/293* (2013.01); *H01L 25/00* (2013.01)

USPC .................................. 257/788; 257/E23.119

(58) Field of Classification Search
USPC ................... 257/684, 778, 788, 793, E23.119
See application file for complete search history.

(56) References Cited

U.S. PATENT DOCUMENTS

| 7,402,901 B2 * | 7/2008 | Hatano et al. ................. 257/684 |
| 2010/0025862 A1 * | 2/2010 | Gruber et al. ................. 257/778 |
| 2014/0035134 A1 * | 2/2014 | Hu ............................... 257/737 |

* cited by examiner

*Primary Examiner* — Quoc Hoang

(74) *Attorney, Agent, or Firm* — Blakely, Sokoloff, Taylor & Zafman LLP (57) ABSTRACT

Epoxy-amine underfill materials for semiconductor packages and semiconductor packages having an epoxy-amine underfill material are described. In an example, a semiconductor apparatus includes a semiconductor die having a surface with an integrated circuit thereon. A semiconductor package substrate has a surface with a plurality of contact pads thereon. A plurality of conductive contacts couples the surface of the semiconductor die to the surface of the semiconductor package substrate. An epoxy-amine underfill material is disposed between the surface of the semiconductor die and the surface of the semiconductor package substrate and surrounds the plurality of conductive contacts. The epoxy-amine underfill has high adhesion and is based on a low volatility multifunctional amine species.

25 Claims, 8 Drawing Sheets

EPOXY-AMINE UNDERFILL MATERIALS FOR SEMICONDUCTOR PACKAGES

TECHNICAL FIELD

Embodiments of the invention are in the field of semiconductor packages and, in particular, epoxy-amine underfill materials for semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system. However, improvements are needed in the materials used to underfill in such flip chip arrangements.

Newer packaging and die-to-die interconnect approaches, such as through silicon via (TSV) and silicon interposer, are gaining much attention from designers for the realization of high performance Multi-Chip Module (MCM) and System in Package (SiP). However, additional improvements in underfill materials are also needed for such newer packaging regimes.

DESCRIPTION OF THE EMBODIMENTS

Epoxy-amine underfill materials for semiconductor packages and semiconductor packages having an epoxy-amine underfill material are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to low yellow color outgassing underfill materials with improved reliability. Embodiments may address one or more of adhesion, delamination, low yellow color, outgassing, or reliability for semiconductor packaging. One or more embodiments describe suitable underfill materials, and the resulting semiconductor packaging products for through silicon via (TSV) designs, level 1 (L1) interfaces or first level interconnect structures, or bumpless build-up layer (BBUL) structures.

To provide a general context, outgassing during curing is one characteristic of epoxy systems. Such outgassing may cause accumulation of volatile species on the wall of a curing oven and exhaust system, which may result in regular tool maintenance labors and potential health issues if ventilation is not sufficient. Studies have shown that the outgassing species are mainly derived from a volatile hardener. To address the hardener outgassing issue, in accordance with an embodiment of the present invention, new underfill formulations have been tested with low content of volatile amine species. The reliability results for initially tested low yellow color formulations showed significantly high risk of underfill sidewall delamination, leading to reliability failures. In order to improve the reliability performance while maintaining low outgassing for new underfill candidates, in accordance with embodiments of the present invention, new molecular designs of hardeners were investigated.

In general, one or more embodiments are directed to enhanced adhesion at underfill/silicon interfaces by introducing adhesion promoters in an underfill formulation. In one such embodiment, underfill hardeners are designed with chemical similarities to volatile hardeners, but having a much lower vapor pressure/higher boiling point. Accordingly, the above described yellowing issue is significantly reduced. Meanwhile, the presence of sterically hindering groups at the vicinity of amine groups can, in one embodiment, provide oxidation resistance at interfaces during reflow. In an embodiment, the reliability performance for such underfill materials as used in semiconductor packaging is similar to that for underfill materials based on volatile hardeners.

To provide specific context, for conventional underfill materials based on low molecular weight hardeners, even though the reliability performance of a semiconductor package fabricated there from is good, the outgassing issue may arise. For conventional high molecular weight hardeners, regardless of the benefit of low outgassing, the reactivity is higher and may result in the degradation of the mechanical properties and interface adhesion due to a change in the morphology of micro-gel in an epoxy system subsequent to curing. In order to combine the benefits of both low molecular weight (MW) hardeners and high MW hardeners (e.g., low outgassing and improved adhesion), embodiments are directed to molecular design of new hardeners, e.g., as described in association with FIG. 3. By comparison, conventional underfill materials either fail yellow color outgassing tests but pass adhesion tests (e.g., for low MW hardeners) or pass yellow color outgassing tests but fail adhesion tests (e.g., for high MW hardeners).

Figure 1:
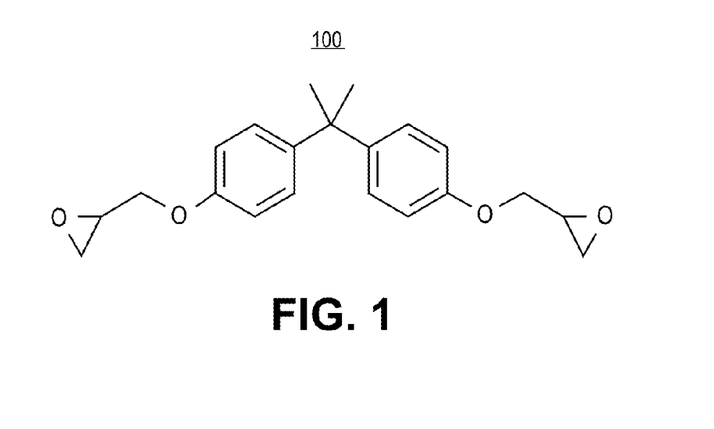
FIG. 1 illustrates a chemical schematic of a representative bi-functional epoxy underfill precursor molecule, in accordance with an embodiment of the present invention.
Figure 2:
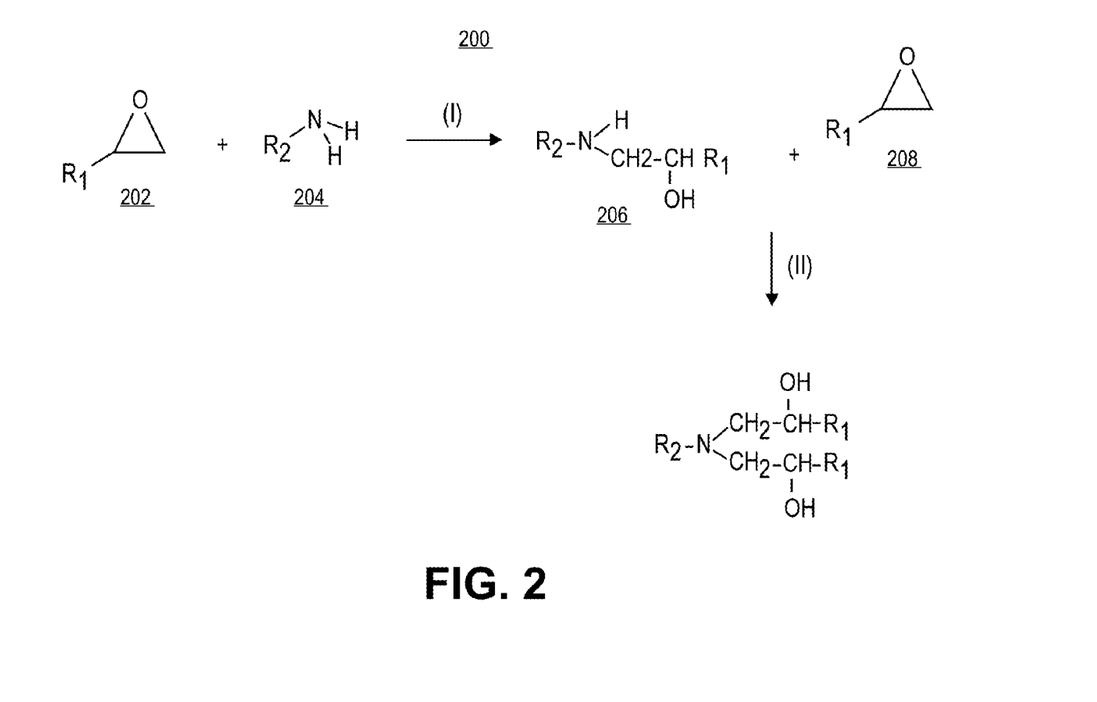
FIG. 2 is a schematic illustrating the reaction of one or more epoxides with an amine to form an underfill material, in accordance with an embodiment of the present invention.

More specific embodiments of the present invention involve fabrication of semiconductor packages using underfill materials based on an epoxy/amine reaction. FIG. 1 illustrates a chemical schematic of a representative bi-functional epoxy underfill precursor molecule 100, in accordance with an embodiment of the present invention. Referring to FIG. 1, the chemical formula of Bisphenol A is provided. FIG. 2 is a schematic 200 illustrating the reaction of one or more epoxides with an amine to form an underfill material, in accordance with an embodiment of the present invention. Referring to FIG. 2, in a first operation (I), an epoxide 202 is reacted with an amine 204, where R1 and R2 are same or different organic ligands or moieties. In a second operation (II), the resulting compound 206 from (I) is reacted with a second epoxide 208 to form a bis-epoxy-amine product 210. In general, one epoxide is reacted with one NH group of an amine to provide an epoxy-amine compound. Thus, in cases involving a primary amine (one organic ligand and two hydrogen atoms on N), two epoxide groups are reacted with the amine, as is the case exemplified in FIG. 2. The epoxide groups may be from two different molecules, as is shown in FIG. 2, or may be part of the same molecule, an example of which is shown in FIG. 1.

Figure 3:
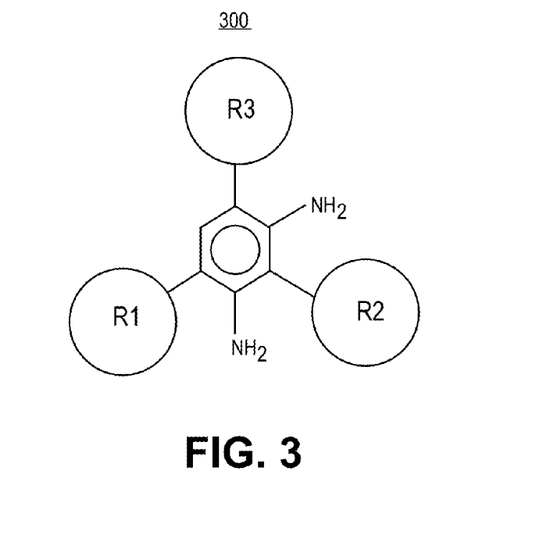
FIG. 3 illustrates a chemical schematic of a representative sterically hindered amine underfill precursor molecule, in accordance with an embodiment of the present invention.

In an embodiment, referring again to FIG. 2, R2 is a moiety that provides steric hindrance on both sides of the amine 204. As a more complex example, FIG. 3 illustrates a chemical schematic of a representative sterically hindered amine underfill precursor molecule 300, in accordance with an embodiment of the present invention. Referring to FIG. 3, a bis-amine is provided, where each amine is a primary amine having two hydrogen atoms. Using R1 as the designation, the structure 300 is based on an ortho-para-bisamine benzyl compound with R2 and R3 in the meta-positions. R1, R2 and R3 are organic ligands or moieties (e.g., carbon-chain based moieties) that can be tailored by controlling the R1, R2 and R3 chain length. That is the overall molecular weight of structure 300 can be determined by selecting appropriate R1, R2 and R3 groups. In one embodiment, by controlling molecular weight, volatility can be reduced and, hence, outgassing can be reduced.

Furthermore, in an embodiment, by controlling the R1, R2 and R3, steric size or cone angle (e.g., by using branched carbon chain moieties), reactivity of structure 300 with epoxides can be controlled for effective stoichiometric reactivity to provide an epoxy-amine underfill product. It is to be understood that the type of epoxides reacted with structure 300 may be varied. However, in a specific embodiment, Bisphenol A is reacted with the ortho-para-bisamine benzyl compound of FIG. 3. It is to be understood that there are four potential sites in structure 300 for reacting with epoxides, namely each of the N—H bonds. As such, a multi-functional amine may be used to fabricate an underfill material. Thus, in an embodiment, through tailoring the R1, R2 and R3 moeities of the structure of FIG. 3, the molecular weight can be controlled almost independent of the chemical functionality. In one such embodiment, then, a reactivity similar to low molecular weight hardeners is achieved. In accordance with an embodiment of the present invention, a multi-functional amine used to fabricate an underfill material is a low volatility multi-functional amine species. In one such embodiment, the term "low volatility" is used to describe a species having a boiling point above standard semiconductor processing conditions, such as above typical underfill curing temperatures. In a specific such embodiment, the low volatility multi-functional amine species has a boiling point well above the typical underfill cure temperature of 150 degrees Celsius. For example, in a particular embodiment, the low volatility multi-functional amine species has a boiling point at least 20 degrees Celsius above the typical underfill cure temperature of 150 degrees Celsius.

Figure 4:
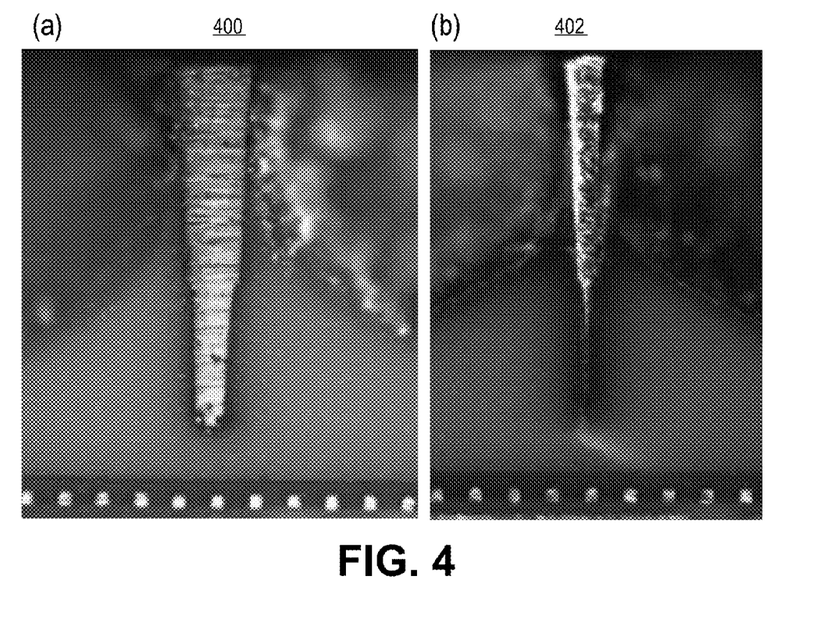
FIG. 4 includes photographs and demonstrating an oxidation stability comparison at a silicon (Si)/underfill interface for (a) an underfill material based on a hardener having steric hindrance and (b) an underfill material based on a hardener without steric hindrance, in accordance with an embodiment of the present invention.

In addition, in an embodiment, the oxidation stability of the underfill material is improved by introducing steric hindrance in the hardener. Therefore, a hardener with both low yellow coloring issues and similar reliability performance (e.g., good mechanical property and low risk of delamination post reliability testing) can be achieved using hardeners based on the structure 300. Exemplifying the oxidation stability, FIG. 4 includes photographs 400 and 402 demonstrating an oxidation stability comparison at a silicon (Si)/underfill interface for (a) an underfill material based on a hardener having steric hindrance and (b) an underfill material based on a hardener without steric hindrance, in accordance with an embodiment of the present invention. Referring to FIG. 4, the underfill material based on a hardener having steric hindrance demonstrates improved oxidation stability.

Figure 5:
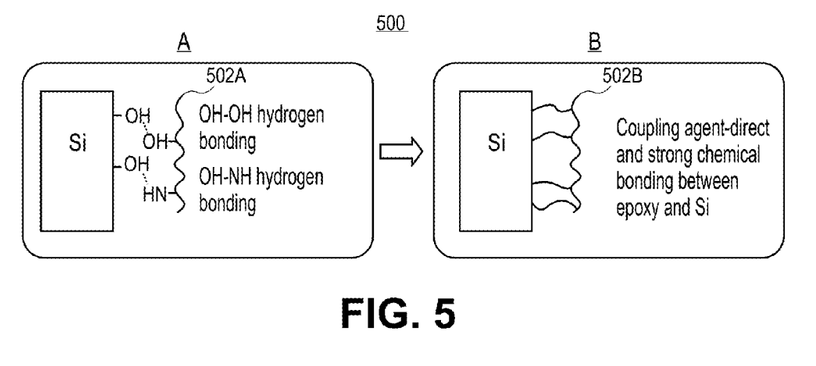
FIG. 5 is a schematic illustrating underfill/Si interfaces, in accordance with an embodiment of the present invention.

In another embodiment, in order to address the adhesion loss as a result of using high molecular weight hardeners, an adhesion promoter is added in the formulation to improve the adhesion at an underfill/Si interface. As an example, FIG. 5 is a schematic 500 illustrating underfill/Si interfaces, in accordance with an embodiment of the present invention. Referring to FIG. 5, the adhesion for an underfill material (502B) is enhanced by promoting the interaction between the underfill 502/Si interface through covalent bonding (pathway B of 500) versus weak H-bonding and van der Waals interactions such as those for an underfill material 502A (pathway A of 500). In one such embodiment, adhesion for an underfill material based on an amine of structure 300, as reacted with one or more epoxides, is improved by use of an adhesion promoter in the underfill formulation.

Figure 6:
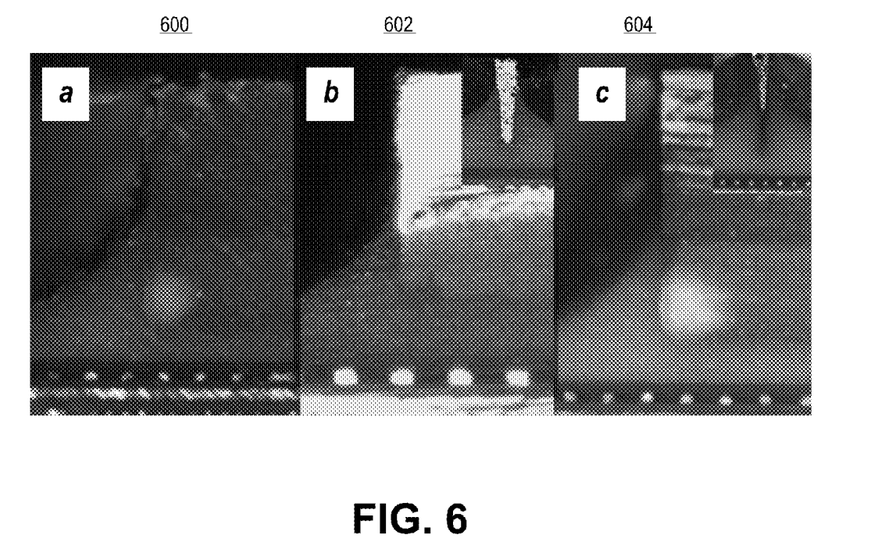
FIG. 6 includes images from sidewall delamination inspection for (a) a conventional underfill material, (b) an underfill material in combination with an adhesion promoter, and (c) an underfill material based on a high molecular weight hardener, in accordance with an embodiment of the present invention.

Embodiments of the present invention may enable fabrication of semiconductor packages having no Si sidewall delamination or oxidation (e.g., no yellow interface at an underfill/Si interface). Test results have confirmed that the low yellow color underfill formulations described herein are statistically equal or better than conventional underfill materials. FIG. 6 includes images 600, 602 and 604 from sidewall delamination inspection for (a) a conventional underfill material, (b) an underfill material in combination with an adhesion promoter, and (c) an underfill material based on a high molecular weight hardener, in accordance with an embodiment of the present invention. The inset to image 604 is a diagonal cross-section of a die for comparison of underfill/Si delamination, underfill cracking, and underfill oxidation.

Embodiments described herein may have far reaching implementations for, e.g., reliability improvement and/or outgassing reduction for reduced tool maintenance. Applications may include, but need not be limited to, CPUs/processors, multi-chip/3D packaging including CPU in combination with other devices, memory (e.g., flash/DRAM/SRAM, etc. Several non-limiting examples are provided below.

Figure 7A:
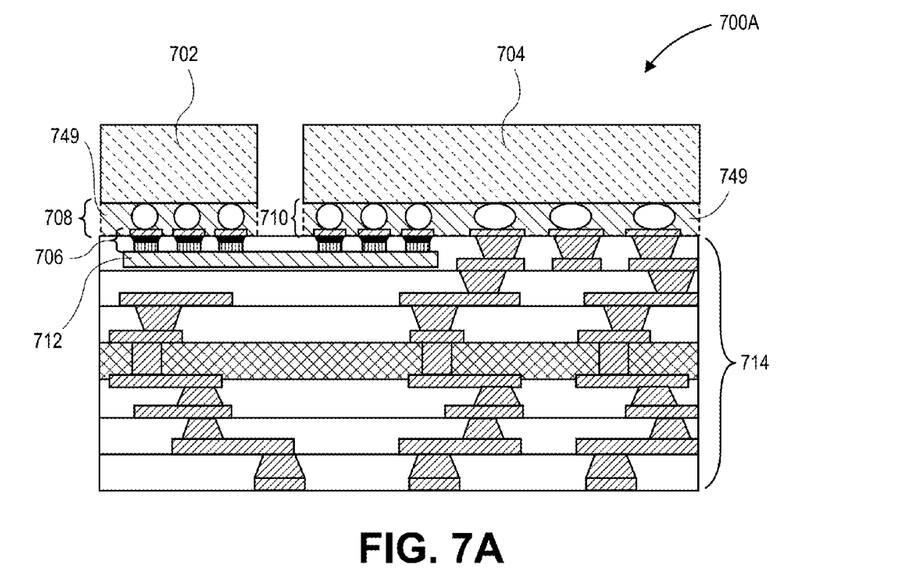
FIG. 7A illustrates a cross-sectional view of a semiconductor package including multiple die coupled with an embedded interconnect bridge (EmIB) and including an epoxy-amine underfill material based on a low volatility hardener, in accordance with an embodiment of the present invention.

In an example implementation, FIG. 7A illustrates a cross-sectional view of a semiconductor package 700A including multiple die coupled with an EmIB and including an epoxy-amine underfill material based on a low volatility hardener, in accordance with an embodiment of the present invention. Referring to FIG. 7A, the semiconductor package 700A includes a first die 702 (such as a CPU, memory chipset, etc.) and a second die 704 (such as a CPU, memory chipset, etc.). The first die 702 and second die 704 are coupled to an EmIB 706 through bumps 708 and 710 of the first die 702 and second die 704, respectively, and bond pads 712 of the silicon bridge, e.g., by thermal compression bonding (TCB). The first die 702, second die 704, and EmIB 706 are included with additional routing layers 714, as depicted in FIG. 7A. The additional routing layers may be simple or complex and may be for coupling to other packages or may form part or all of an organic package or printed circuit board (PCB), etc. An epoxy-amine underfill material 749 based on a low volatility hardener, such as those described herein, is included between the first die 702 and the EmIB 712/structure 714 interface and between the second die 704 and the EmIB 712/structure 714 interface. In one embodiment, the epoxy-amine underfill material 749 is bonded using an adhesion promoter. In another embodiment, a silicon bridge is used and is not embedded in the package, but rather in an open cavity.

Figure 7B:
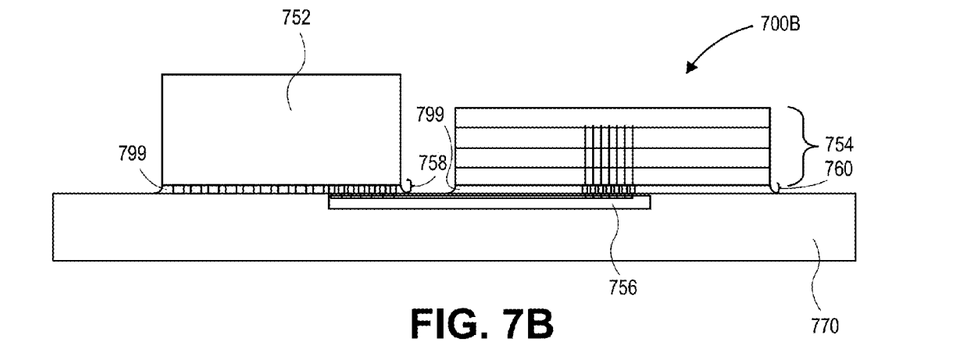
FIG. 7B illustrates a cross-sectional view of a semiconductor package including multiple die coupled with an embedded interconnect bridge (EmIB) and including an epoxy-amine underfill material based on a low volatility hardener, in accordance with an embodiment of the present invention.

In another example implementation, FIG. 7B illustrates a cross-sectional view of a semiconductor package 700B including multiple die coupled with an embedded interconnect bridge (EmIB) and including an epoxy-amine underfill material based on a low volatility hardener, in accordance with an embodiment of the present invention. Referring to FIG. 7B, the semiconductor package 700B includes a first die 752 (such as a central processing unit, CPU) and a second die 754 (such as an additional CPU or a memory die or memory die stack, the memory die stack depicted in FIG. 7B). The first die 752 and second die 754 are coupled to an EmIB 756 through bumps 758 and 760 of the first die 752 and second die 754, respectively, e.g., by thermal compression bonding (TCB). The EmIB 756 is embedded in a substrate (e.g., flexible organic substrate) or board (such as epoxy PCB material) material 770, as depicted in FIG. 7B. An epoxy-amine underfill material 799 based on a low volatility hardener, such as those described herein, is included between the first die 752 and the EmIB 756/substrate 770 interface and between the second die 754 and the EmIB 756/substrate 770 interface. In one embodiment, the epoxy-amine underfill material 799 is bonded with improved adhesion using an adhesion promoter in the formulation.

Figure 8:
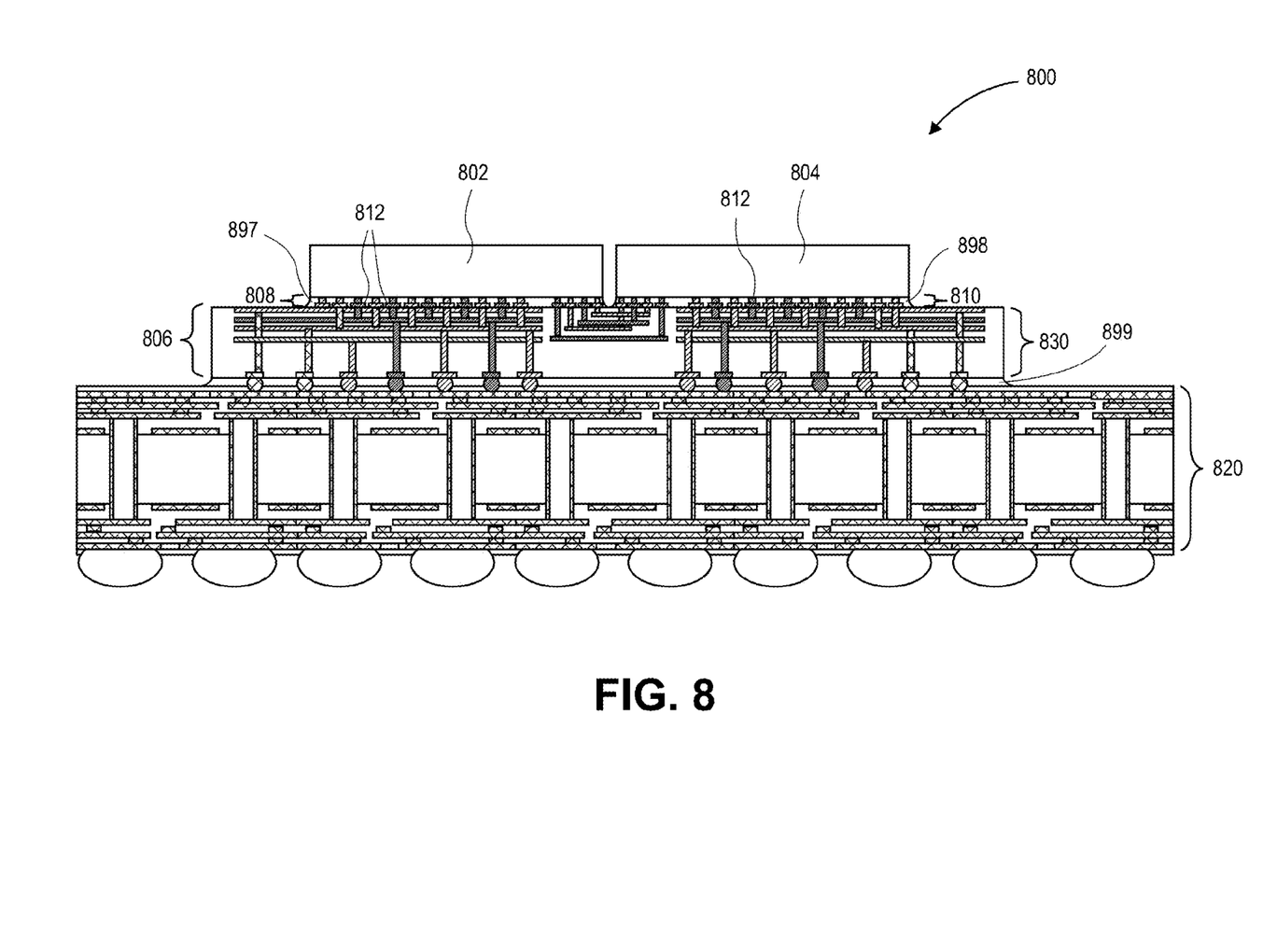
FIG. 8 illustrates a cross-sectional view of a semiconductor package including multiple die coupled with an interposer and including an epoxy-amine underfill material based on a low volatility hardener, in accordance with an embodiment of the present invention.

In another exemplary implementation, FIG. 8 illustrates a cross-sectional view of a semiconductor package 800 including multiple die coupled with an interposer and including an epoxy-amine underfill material based on a low volatility hardener, in accordance with an embodiment of the present invention. Referring to FIG. 8, the semiconductor package 800 includes a first die 802 and a second die 804. The first die 802 and second die 804 are coupled to an interposer 806, such as a silicon interposer. The first die 802 and second die 804 are coupled to the interposer 806 through bumps 808 and 810 of the first die 802 and second die 804, respectively, and bond pads 812 of the interposer 806, e.g., by thermal compression bonding (TCB). The interposer 806 couples the first die 802 and second die 804 with an organic package 820. The organic package 820 may include its own routing layers, as depicted in FIG. 8. Coupling through interposer 806 may be achieved by use of through silicon vias (TSVs) 830, as is also depicted in FIG. 8. In an embodiment, as depicted, possible locations for including an epoxy-amine underfill material based on a low volatility hardener 897, 898 or 898, such as those described herein, is between the first die 802 and interposer 806, between the second die 804 and interposer 806, and between the interposer 806 and package 820. In one embodiment, one or more of the epoxy-amine underfill materials 897, 898 and 899 is bonded with improved adhesion using an adhesion promoter in the formulation.

In another aspect, various 3D integrated circuit packages with through-mold first level interconnects and including an epoxy-amine underfill material based on a low volatility hardener, in accordance with embodiments of the present invention.

Figure 9:
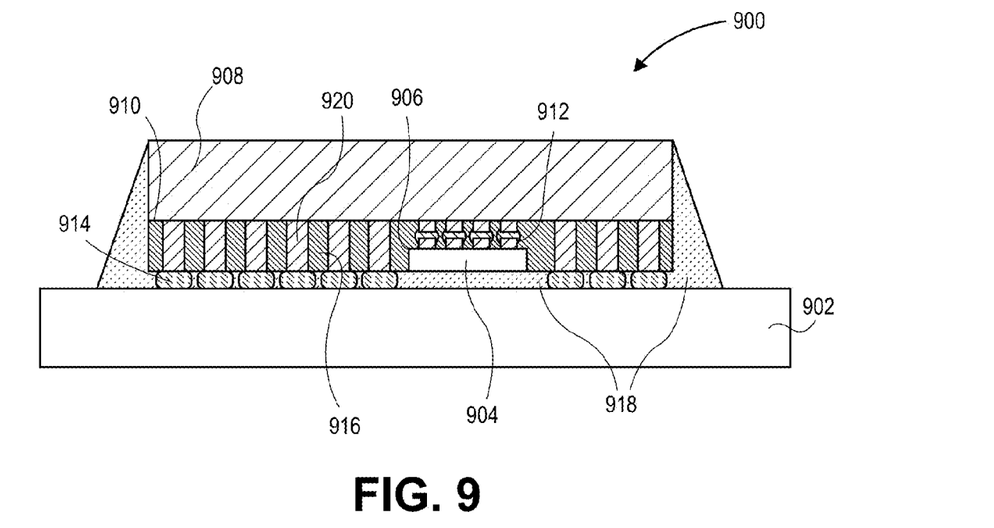
FIG. 9 illustrates a cross-sectional view of a 3D integrated circuit package with through-mold first level interconnects and including an epoxy-amine underfill material based on a low volatility hardener, in accordance with an embodiment of the present invention.

In a first example, Referring to FIG. 9, a semiconductor package 900 includes a substrate 902. A bottom semiconductor die 904 has an active side 906 with a surface area. The bottom semiconductor die 904 is coupled to the substrate 902 with the active side 906 distal from the substrate 902. A top semiconductor die 908 has an active side 910 with a surface area larger than the surface area of the bottom semiconductor die 904. The top semiconductor die 908 is coupled to the substrate 902 with the active side 910 proximate to the substrate 902. The active side 906 of the bottom semiconductor die 904 is facing and conductively coupled to the active side 910 of the top semiconductor die 908 by die to die interconnect structures 912 (e.g., composed of soldered bumps from each of the die). The top semiconductor die 908 is conductively coupled to the substrate 902 by first level interconnects 914 that bypass the bottom semiconductor die 904. The top semiconductor die 908 is further conductively coupled to the substrate 902 by a plurality of bumps 920 (e.g., tall copper bumps) that extend from the active side 910 of the top semiconductor die 908 and adjacent to the bottom semiconductor die 904. The plurality of bumps 920 is coupled to the first level interconnects 914. In an embodiment, the bottom semiconductor die 904 and the plurality of bumps 920 are housed in a molding layer 916, as depicted in FIG. 9. In an embodiment, the top semiconductor die 908 and the bottom semiconductor die 904 are further coupled to the substrate 902 by an epoxyamine underfill material based on a low volatility hardener 918, as is also depicted in FIG. 9. In one embodiment, the epoxy-amine underfill material 918 is bonded with improved adhesion using an adhesion promoter in the formulation.

In an embodiment, the top semiconductor die 908 is configured to provide power to the bottom semiconductor die 904. In an embodiment, the top semiconductor die 908 is configured to facilitate communication between the bottom semiconductor die 904 and the substrate 904, e.g., through routing in the substrate 908. In an embodiment, the bottom semiconductor die 904 has no through silicon vias (TSVs). Thus, connection between the bottom die 904 and substrate 902 is achieved indirectly through interconnect lines on the top die 908 as well as the FLI bumps 914. It is to be understood, however, that, in an alternative embodiment, a bottom die may be connected directly by using TSV on the bottom die.

Thus, in reference to FIG. 9, for a 3D IC with through-mold FLI, bottom and top active die are stacked face-to-face. No TSV may be necessary to achieve such 3D IC stacking FLI copper bumps are embedded in a molding layer. The top and bottom die have a common interface underfilled by the molding compound. Fabrication-wise, the final 3D IC stacked die with through mold first level interconnect (FLI) is attached to a package substrate, under-filled, and subsequently assembled.

One or both of the semiconductor die 904 or 908 may be formed from a semiconductor substrate, such as a single crystalline silicon substrate. Other materials, such as, but not limited to, group III-V material and germanium or silicon germanium material substrates may also be considered. The active side (906 or 910, respectively) of the semiconductor die 904 or 908 may be the side upon which semiconductor devices are formed. In an embodiment, the active side 906 or 910 of the semiconductor die 904 or 908, respectively, includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments.

Stacked die apparatus 900 may be particularly suitable for packaging a memory die with a logic die. For example, in an embodiment, one of die 904 or 908 is a memory die. The other die is a logic die. In an embodiment of the present invention, the memory die is a memory device, such as but not limited to a static random access memory (SRAM), a dynamic access memory (DRAM), a nonvolatile memory (NVM) and the logic die is a logic device, such as but not limited to a microprocessor and a digital signal processor.

In accordance with an embodiment of the present invention, one or more of die interconnect structures 912, plurality of bumps 920, or first level interconnects 914 is composed of an array of metal bumps. In one embodiment, each metal bump is composed of a metal such as, but not limited to, copper, gold, or nickel. Substrate 902 may be a flexible substrate or a rigid substrate, depending upon the specific application. In an embodiment, substrate 902 has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA).

With respect to molding layer 916, several options may be used to fabricate the layer. In an embodiment, an FLI bump and bottom-die over-mold approach is used. In one embodiment, the over-mold layer is subsequently grinded back to expose the FLI bumps. In one embodiment, grind back is performed close to the bump (e.g., copper bump) and then laser ablation is used to open the copper bumps. Subsequently, solder paste print or micro-ball attach is performed onto the copper bumps. In one embodiment, directly laser open of the copper bumps is performed without any grind back. A solder operation may similarly be performed as above. In another embodiment, bump and bottom die molding are exposed with a polymer film above the FLI bumps and bottom die. No bump exposure is needed; however, cleaning of the FLI Cu bump may be needed by plasma, or laser, etc. In another embodiment, transfer or compression mold is used. In another embodiment, capillary underfill layer formation is extended to cover the FLI bumps in instead of conventional molding. The molding layer 916 may be composed of a non-conductive material. In one embodiment, the molding layer 916 is composed of a material such as, but not limited to, a plastic or an epoxy resin composed of silica fillers.

Figure 10:
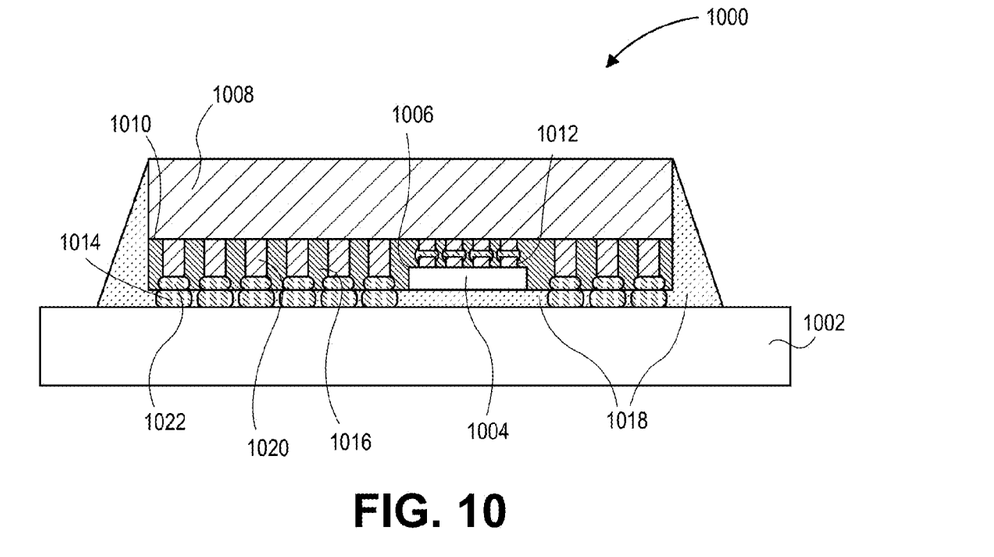
FIG. 10 illustrates a cross-sectional view of a 3D integrated circuit package with through-mold first level interconnects and including an epoxy-amine underfill material based on a low volatility hardener, in accordance with an embodiment of the present invention.

In a second example, Referring to FIG. 10, a semiconductor package 1000 includes a substrate 1002. A bottom semiconductor die 1004 has an active side 1006 with a surface area. The bottom semiconductor die 1004 is coupled to the substrate 1002 with the active side 1006 distal from the substrate 1002. A top semiconductor die 1008 has an active side 1010 with a surface area larger than the surface area of the bottom semiconductor die 1004. The top semiconductor die 1008 is coupled to the substrate 1002 with the active side 1010 proximate to the substrate 1002. The active side 1006 of the bottom semiconductor die 1004 is facing and conductively coupled to the active side 1010 of the top semiconductor die 1008 by die to die interconnect structures 1012. The top semiconductor die 1008 is conductively coupled to the substrate 1002 by first level interconnects 1014 that bypass the bottom semiconductor die 1004. The top semiconductor die 1008 is further conductively coupled to the substrate 1002 by a plurality of bumps 1020 that extend from the active side 1010 of the top semiconductor die 1008, and at least partially adjacent to the bottom semiconductor die 1004, to a plurality of solder balls 1022. The plurality of solder balls 1022 is coupled to the first level interconnects 1014. In an embodiment, the bottom semiconductor die 1004, the plurality of bumps 1020, and the plurality of solder balls 1022 are housed in a molding layer 1016, as depicted in FIG. 10. In an embodiment, the top semiconductor die 1008 and the bottom semiconductor die 1004 are further coupled to the substrate 1002 by an epoxy-amine underfill material based on a low volatility hardener 1018, as is also depicted in FIG. 10. In one embodiment, the epoxy-amine underfill material 1018 is bonded with improved adhesion using an adhesion promoter in the formulation.

Thus, in reference to FIG. 10, another approach for a 3D IC with through-mold FLI includes disposing solder inside a molding layer. The solder may be placed before molding and then exposed by grind back or laser open. Alternatively, solder paste may be placed after laser opening through copper bumps. The characteristics and configurations of the packaged die and the materials of package 1000 may be the same or similar to those described above for package 900. In an embodiment, the solder balls 1022 are composed of lead or are lead free, such as alloys of gold and tin solder or silver and tin solder.

In reference to FIGS. 9 and 10, mixed FLI bump heights may be used for a top semiconductor die. For example, in one embodiment, a mixed height FLI bump is created by using a top-hat or a slender copper column bumping process. Here, the first bumping mask and plating operation provides short bump heights for both FLI and LMI. The second bumping mask and plating operation provides only the FLI bumps as taller. It is to be understood that various combinations of copper and solder bumping may be performed for FLI, as shown FIGS. 9 and 10.

In another aspect of the present invention, coreless substrates with embedded stacked through-silicon via die are disclosed. For example, a semiconductor die with C4 solder ball connections may be packaged in a Bumpless Build-Up Layer or BBUL processor packaging technology. Such a process is bumpless since it does not use the usual tiny solder bumps to attach the silicon die to the processor package wires. It has build-up layers since it is grown or built-up around the silicon die. Additionally, some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA). In a specific example involving stacked die, FIG. 11 illustrates a cross-sectional view of a coreless substrate with an embedded stacked through-silicon via die and including an epoxy-amine underfill material based on a low volatility hardener, in accordance with an embodiment of the present invention.

Figure 11:
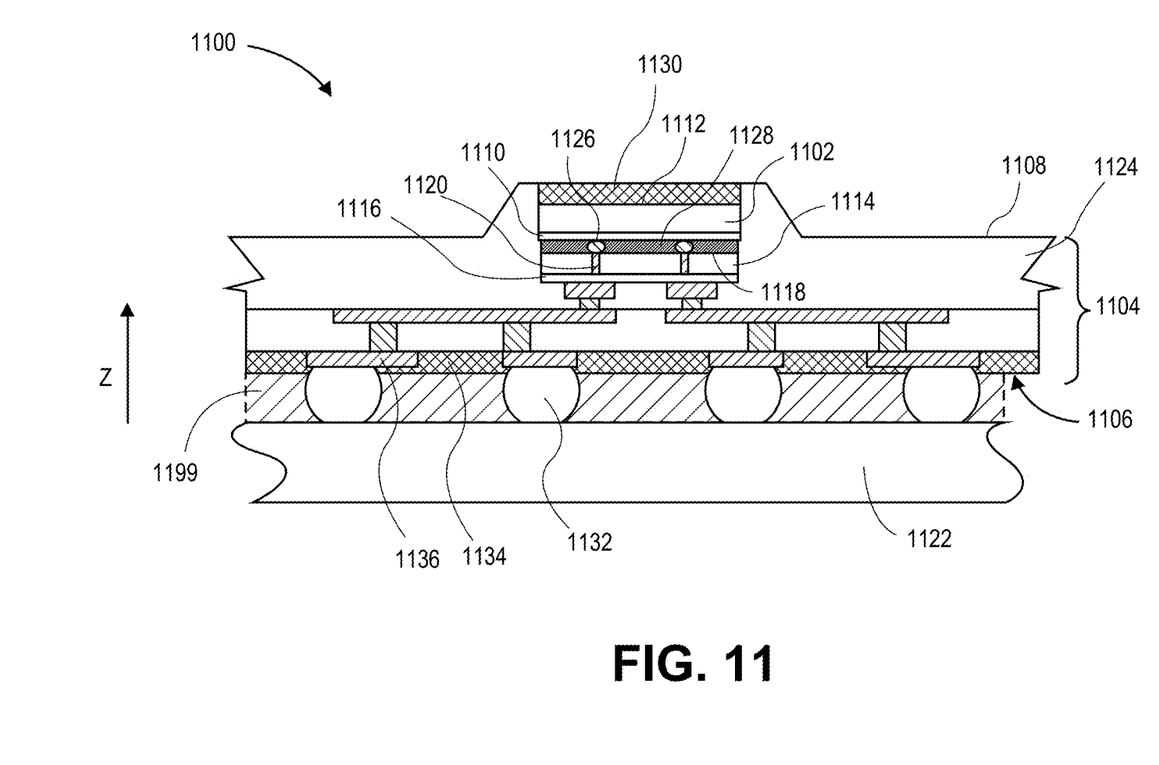
FIG. 11 illustrates a cross-sectional view of a coreless substrate with an embedded stacked through-silicon via die and including an epoxy-amine underfill material based on a low volatility hardener, in accordance with an embodiment of the present invention.

Referring to FIG. 11, a stacked die apparatus 1100 includes a first die 1102 embedded in a coreless substrate 1104. The coreless substrate 1104 includes a land side 1106 and a die side 1108. The first die 1102 also includes an active surface, or device side, 1110 and a backside surface, or backside, 1112 and it can be seen that the active surface 1110 of the first die 1102 faces toward the land side 1106 while the backside 1112 faces in the same direction as the die side 1108 of coreless substrate 1104. The active surface may include a plurality of semiconductor devices, such as but not limited to transistors, capacitors and resistors interconnected together by a die interconnection structure into functional circuits to thereby form an integrated circuit.

As will be understood to those skilled in the art, the device side 1110 of first die 1102 includes an active portion with integrated circuitry and interconnections (not shown). The first die 1102 may be any appropriate integrated circuit device including but not limited to a microprocessor (single or multi-core), a memory device, a chipset, a graphics device, an application specific integrated circuit according to several different embodiments. In an embodiment, the stacked die apparatus 1100 also includes a die-bonding film 1130 disposed on the backside 1112 of the first die 1102.

In an embodiment, the first die 102 is part of a larger apparatus that includes a second die 1114 that is disposed below the die side 1108 and that is coupled to the first die 1102. The second die 1114 is also illustrated with an active surface, or device side 1116 in simplified depiction, but it may also have metallization M1 to M11 or any number and top metallization thicknesses. Second die 1114 also has a backside surface, or backside, 1118.

Second die 1114 is also embedded in the coreless substrate 1104. In an embodiment, the second die 1114 has at least one through-silicon via 1120. Two through-silicon vias are depicted, one of which is enumerated, but the two illustrated through-silicon vias are presented for simplicity. In an embodiment, up to 1000 through-silicon vias are found in the second die 1114. The second die 1114 may therefore be referred to as a die including a through-silicon via disposed therein (TSV die 1114). The device side 1116 of the TSV die 1114 faces toward the land side 1106 while the backside 1118 faces toward the die side 1108 of coreless substrate 1104. As will be understood to those skilled in the art, the device side 1116 of the TSV die 1114 also includes an active portion with integrated circuitry and interconnections (not shown). The TSV die 1114 may be any appropriate integrated circuit device including but not limited to a microprocessor (single or multi-core), a memory device, a chipset, a graphics device, an application specific integrated circuit according to several different embodiments.

As depicted, the first die 1102 is coupled to the TSV die 1114 though the at least one through-silicon via 1120. In an embodiment, the first die 1102 is electrically coupled to the TSV die 1114 through the one or more through-silicon vias. In one embodiment, the first die 1102 is electrically coupled to the TSV die 1114 through the one or more through-silicon vias 120 by one or more corresponding conductive bumps 126 disposed on the first die 1102 and by one or more bond pads (not shown) disposed on the TSV die 1114. The bond pads are included on the backside 1118 of TSV die 1114 and in alignment with the one or more through-silicon vias 1120. In an embodiment, a layer of epoxy flux material 1128 is disposed between the first die 1102 and the TSV die 1114. In an embodiment, the coreless substrate 1104 is free from additional routing layers between the first die 1102 and the TSV die 1114. That is, in an embodiment, the first die 1102 and the TSV die 1114 communicate solely through conductive bumps on the device side 1110 of first die 102 and the one or more through-silicon vias 1120 of TSV die 1114.

The TSV die 1114 is also illustrated with a metallization on device side 1118 in simplified form. The metallization is in contact with the integrated circuitry in the TSV die 1114 at the device side 1116. In an embodiment, the metallization has metal-one (M1) to metal-eleven (M11) metallization layers in order to pin out the complexity of the TSV die 1114 to the outside world, where M1 is in contact with the integrated circuitry in the TSV die 1114. In selected embodiments, any number of metallizations between M1 and M11 are present. In an example embodiment, the TSV die 1114 has metallizations from M1 to M7 and M7 is thicker than M1 to M6. Other metallization numbers and thickness combinations may be achieved depending upon a given application utility.

In an embodiment, as depicted in FIG. 11, stacked die apparatus 1100 includes a foundation substrate 1122 at the land side 1106 of coreless substrate 1104. For example, where the first die 1102 and TSV die 1114 are part of a hand-held device such as a smart phone embodiment or a hand-held reader embodiment, the foundation substrate 1122 is a motherboard. In an example embodiment, where the first die 1102 and TSV die 1114 are part of a hand-held device such as a smart phone embodiment or a hand-held reader embodiment, the foundation substrate 1122 is an external shell such as the portion an individual touches during use. In an example embodiment, where the first die 1102 and TSV die 1114 are part of a hand-held device such as a smart phone embodiment or a hand-held reader embodiment, the foundation substrate 1122 includes both the motherboard and an external shell such as the portion an individual touches during use. In an embodiment, coreless substrate 1104 is further coupled to the foundation substrate 1122 by an epoxy-amine underfill material based on a low volatility hardener 1199, as is also depicted in FIG. 11. In one embodiment, the epoxy-amine underfill material 1199 is bonded with improved adhesion using an adhesion promoter in the formulation.

An array of external conductive contacts 1132 is disposed on the land side 1106 of the coreless substrate 1104. In an embodiment, the external conductive contacts 1132 couple the coreless substrate 1104 to the foundation substrate 1122. The external conductive contacts 1132 are used for electrical communication with the foundation substrate 1122. In one embodiment, the array of external conductive contacts 1132 is a ball grid array (BGA). A solder mask 1134 makes up the material that forms the land side 1106 of the coreless substrate 1104. The external conductive contacts 1132 are disposed upon bump bond pads 1136.

Figure 12:
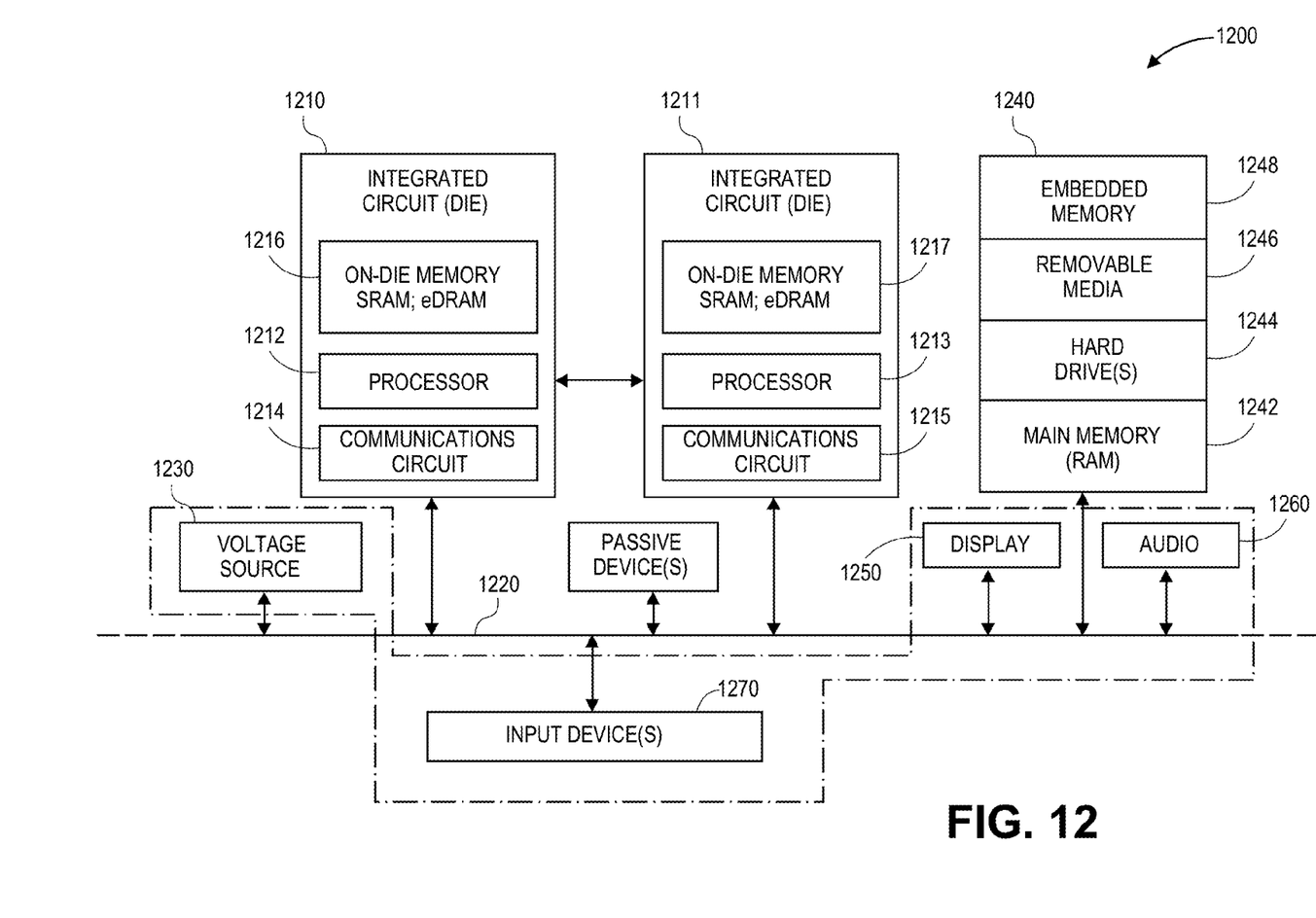
FIG. 12 is a schematic of a computer system, in accordance with an embodiment of the present invention.

FIG. 12 is a schematic of a computer system 1200, in accordance with an embodiment of the present invention. The computer system 1200 (also referred to as the electronic system 1200) as depicted can embody a semiconductor package having an epoxy-amine underfill material according to any of the several disclosed embodiments and their equivalents as set forth in this disclosure. The computer system 1200 may be a mobile device such as a netbook computer. The computer system 1200 may be a mobile device such as a wireless smart phone. The computer system 1200 may be a desktop computer. The computer system 1200 may be a hand-held reader. The computer system 1200 may be a server system. The computer system 1200 may be a supercomputer or high-performance computing system.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 may mean any type of circuit such as, but not limited to, a microprocessor, a microcontroller, a graphics processor, a digital signal processor, or another processor. In an embodiment, the processor 1212 is housed in a semiconductor package having an epoxy-amine underfill material, as disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems, or a communications circuit for servers. In an embodiment, the integrated circuit 1210 includes on-die memory 1216 such as static random-access memory (SRAM). In an embodiment, the integrated circuit 1210 includes embedded on-die memory 1216 such as embedded dynamic random-access memory (eDRAM).

In an embodiment, the integrated circuit 1210 is complemented with a subsequent integrated circuit 1211. Useful embodiments include a dual processor 1213 and a dual communications circuit 1215 and dual on-die memory 1217 such as SRAM. In an embodiment, the dual integrated circuit 1210 includes embedded on-die memory 1217 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. The external memory 1240 may also be embedded memory 1248 such as the first die in a die stack, according to an embodiment.

In an embodiment, the electronic system 1200 also includes a display device 1250, an audio output 1260. In an embodiment, the electronic system 1200 includes an input device such as a controller 1270 that may be a keyboard, mouse, trackball, game controller, microphone, voice-recognition device, or any other input device that inputs information into the electronic system 1200. In an embodiment, an input device 1270 is a camera. In an embodiment, an input device 1270 is a digital sound recorder. In an embodiment, an input device 1270 is a camera and a digital sound recorder.

As shown herein, the integrated circuit 1210 can be implemented in a number of different embodiments, including in a semiconductor package having an epoxy-amine underfill material, according to any of the several disclosed embodiments and their equivalents, an electronic system, a computer system, one or more methods of fabricating an integrated circuit, and one or more methods of fabricating an electronic assembly that includes a semiconductor package having an epoxy-amine underfill material according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a semiconductor package having an epoxy-amine underfill material embodiments and their equivalents. A foundation substrate may be included, as represented by the dashed line of FIG. 12. Passive devices may also be included, as is also depicted in FIG. 12.

Embodiments of the present invention include epoxy-amine underfill materials for semiconductor packages and semiconductor packages having an epoxy-amine underfill material.

In an embodiment, a semiconductor apparatus includes a semiconductor die having a surface with an integrated circuit thereon. A semiconductor package substrate has a surface with a plurality of contact pads thereon. A plurality of conductive contacts couples the surface of the semiconductor die to the surface of the semiconductor package substrate. An epoxy-amine underfill material is disposed between the surface of the semiconductor die and the surface of the semiconductor package substrate and surrounds the plurality of conductive contacts. The epoxy-amine underfill has high adhesion and is based on a low volatility multi-functional amine species.

In one embodiment, the multi-functional amine species is an ortho-para-bisamine benzyl compound.

In one embodiment, the ortho-para-bisamine benzyl compound includes an organic moiety in each of the meta-positions.

In one embodiment, the amine moieties of the ortho-para-bisamine benzyl compound are primary amine moieties.

In one embodiment, the epoxy-amine underfill material is formed from a reaction between a bis-epoxide compound and the multi-functional amine species.

In one embodiment, the epoxy-amine underfill material is adhered to the surface of the semiconductor die and to the surface of the semiconductor package substrate by an adhesion promoter.

In an embodiment, a semiconductor package includes first and second adjacent semiconductor dies. A silicon bridge structure electrically couples the first and second semiconductor dies. The silicon bridge includes a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer. A plurality of package routing layers is also includes. The silicon bridge structure is disposed in one of the package routing layers, the first and second die are disposed on the plurality of package routing layers, and at least one of the first and second die is electrically coupled to the plurality of package routing layers. An epoxy-amine underfill material is disposed between the silicon bridge and the first semiconductor die and between the silicon bridge and the second semiconductor die. The epoxy-amine underfill has high adhesion and is based on a low volatility multi-functional amine species.

In one embodiment, the multi-functional amine species is an ortho-para-bisamine benzyl compound.

In one embodiment, the ortho-para-bisamine benzyl compound includes an organic moiety in each of the meta-positions.

In one embodiment, the amine moieties of the ortho-para-bisamine benzyl compound are primary amine moieties.

In one embodiment, the epoxy-amine underfill material is formed from a reaction between a bis-epoxide compound and the multi-functional amine species.

In one embodiment, the epoxy-amine underfill material is adhered to the silicon bridge, to the first semiconductor die, and to the second semiconductor die by an adhesion promoter.

In an embodiment, a semiconductor package includes first and second adjacent semiconductor dies. A silicon interposer structure is disposed below and electrically couples the first and second semiconductor dies. The silicon interposer structure includes a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer. An organic package substrate is disposed below and electrically coupled to the silicon interposer structure. The organic package substrate includes a plurality of routing layers therein. An epoxy-amine underfill material is disposed between the silicon interposer structure and the first semiconductor die, between the silicon interposer structure and the second semiconductor die, and between the silicon interposer structure and the organic package substrate. The epoxy-amine underfill has high adhesion and is based on a low volatility multi-functional amine species.

In one embodiment, the multi-functional amine species is an ortho-para-bisamine benzyl compound.

In one embodiment, the ortho-para-bisamine benzyl compound includes an organic moiety in each of the meta-positions.

In one embodiment, the amine moieties of the ortho-para-bisamine benzyl compound are primary amine moieties.

In one embodiment, the epoxy-amine underfill material is formed from a reaction between a bis-epoxide compound and a multi-functional amine species.

In one embodiment, the epoxy-amine underfill material is adhered to the silicon interposer structure, to the first semiconductor die, to the second semiconductor die, and to the organic package substrate by an adhesion promoter.

In one embodiment, the organic package substrate is electrically coupled to the silicon interposer structure by one or more through-silicon-vias (TSVs) disposed in the silicon interposer structure.

In an embodiment, a bumpless build-up layer (BBUL) semiconductor apparatus includes a semiconductor die having a backside and a device side. A coreless substrate includes a land side and a die side. The semiconductor die is embedded in the coreless substrate, with the backside of the semiconductor die facing the die side of the coreless substrate, and the device side of the semiconductor die facing the land side of the coreless substrate. A foundation substrate is also included. An array of external conductive contacts is disposed on the land side of the coreless substrate, electrically coupling the coreless substrate to the foundation substrate. An epoxy-amine underfill material is disposed between the land side of the coreless substrate and the foundation substrate and surrounds the plurality of external conductive contacts. The epoxy-amine underfill has high adhesion and is based on a low volatility multi-functional amine species.

In one embodiment, the multi-functional amine species is an ortho-para-bisamine benzyl compound.

In one embodiment, the ortho-para-bisamine benzyl compound includes an organic moiety in each of the meta-positions.

In one embodiment, the amine moieties of the ortho-para-bisamine benzyl compound are primary amine moieties.

In one embodiment, the epoxy-amine underfill material is formed from a reaction between a bis-epoxide compound and the multi-functional amine species.

In one embodiment, the epoxy-amine underfill material is adhered to the land side of the coreless substrate and to the foundation substrate by an adhesion promoter.

What is claimed is:
1. A semiconductor apparatus, comprising:
  a semiconductor die having a surface with an integrated circuit thereon;
  a semiconductor package substrate having a surface with a plurality of contact pads thereon;

a plurality of conductive contacts coupling the surface of the semiconductor die to the surface of the semiconductor package substrate; and an epoxy-amine underfill material disposed between the surface of the semiconductor die and the surface of the semiconductor package substrate and surrounding the plurality of conductive contacts, the epoxy-amine underfill having high adhesion and based on a low volatility multi-functional amine species, wherein the multi-functional amine species is an ortho-para-bisamine benzyl compound.

2. The semiconductor apparatus of claim 1, wherein the ortho-para-bisamine benzyl compound comprises an organic moiety in each of the meta-positions.

3. The semiconductor apparatus of claim 1, wherein the amine moieties of the ortho-para-bisamine benzyl compound are primary amine moieties.

4. The semiconductor apparatus of claim 1, wherein the epoxy-amine underfill material is formed from a reaction between a bis-epoxide compound and the multi-functional amine species.

5. The semiconductor apparatus of claim 1, wherein the epoxy-amine underfill material is adhered to the surface of the semiconductor die and to the surface of the semiconductor package substrate by an adhesion promoter.

6. A semiconductor package, comprising:

first and second adjacent semiconductor dies;

a silicon bridge structure electrically coupling the first and second semiconductor dies, and comprising a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer;

a plurality of package routing layers, wherein the silicon bridge structure is disposed in one of the package routing layers, the first and second die are disposed on the plurality of package routing layers, and at least one of the first and second die is electrically coupled to the plurality of package routing layers; and an epoxy-amine underfill material disposed between the silicon bridge and the first semiconductor die and between the silicon bridge and the second semiconductor die, the epoxy-amine underfill having high adhesion and based on a low volatility multi-functional amine species, wherein the multi-functional amine species is an ortho-para-bisamine benzyl compound.

7. The semiconductor package of claim 6, wherein the ortho-para-bisamine benzyl compound comprises an organic moiety in each of the meta-positions.

8. The semiconductor package of claim 6, wherein the amine moieties of the ortho-para-bisamine benzyl compound are primary amine moieties.

9. The semiconductor package of claim 6, wherein the epoxy-amine underfill material is formed from a reaction between a bis-epoxide compound and the multi-functional amine species.

10. The semiconductor package of claim 6, wherein the epoxy-amine underfill material is adhered to the silicon bridge, to the first semiconductor die, and to the second semiconductor die by an adhesion promoter.

11. A semiconductor package, comprising:

first and second adjacent semiconductor dies;

a silicon interposer structure disposed below and electrically coupling the first and second semiconductor dies, and comprising a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer;

an organic package substrate disposed below and electrically coupled to the silicon interposer structure, the organic package substrate comprising a plurality of routing layers therein; and an epoxy-amine underfill material disposed between the silicon interposer structure and the first semiconductor die, between the silicon interposer structure and the second semiconductor die, and between the silicon interposer structure and the organic package substrate, the epoxy-amine underfill having high adhesion and based on a low volatility multi-functional amine species, wherein the multi-functional amine species is an ortho-para-bisamine benzyl compound.

12. The semiconductor package of claim 11, wherein the ortho-para-bisamine benzyl compound comprises an organic moiety in each of the meta-positions.

13. The semiconductor package of claim 11, wherein the amine moieties of the ortho-para-bisamine benzyl compound are primary amine moieties.

14. The semiconductor package of claim 11, wherein the epoxy-amine underfill material is formed from a reaction between a bis-epoxide compound and a multi-functional amine species.

15. The semiconductor package of claim 11, wherein the epoxy-amine underfill material is adhered to the silicon interposer structure, to the first semiconductor die, to the second semiconductor die, and to the organic package substrate by an adhesion promoter.

16. The semiconductor package of claim 11, wherein the organic package substrate is electrically coupled to the silicon interposer structure by one or more through-silicon-vias (TSVs) disposed in the silicon interposer structure.

17. A bumpless build-up layer (BBUL) semiconductor apparatus, comprising:

a semiconductor die having a backside and a device side;

a coreless substrate comprising a land side and a die side, wherein the semiconductor die is embedded in the coreless substrate, the backside of the semiconductor die facing the die side of the coreless substrate, and the device side of the semiconductor die facing the land side of the coreless substrate;

a foundation substrate;

an array of external conductive contacts disposed on the land side of the coreless substrate, electrically coupling the coreless substrate to the foundation substrate; and an epoxy-amine underfill material disposed between the land side of the coreless substrate and the foundation substrate and surrounding the plurality of external conductive contacts, the epoxy-amine underfill having high adhesion and based on a low volatility multi-functional amine species, wherein the multi-functional amine species is an ortho-para-bisamine benzyl compound.

18. The BBUL semiconductor apparatus of claim 17, wherein the ortho-para-bisamine benzyl compound comprises an organic moiety in each of the meta-positions.

19. The BBUL semiconductor apparatus of claim 17, wherein the amine moieties of the ortho-para-bisamine benzyl compound are primary amine moieties.

20. The BBUL semiconductor apparatus of claim 17, wherein the epoxy-amine underfill material is formed from a reaction between a bis-epoxide compound and the multi-functional amine species.

21. The BBUL semiconductor apparatus of claim 17, wherein the epoxy-amine underfill material is adhered to the land side of the coreless substrate and to the foundation substrate by an adhesion promoter.

22. A bumpless build-up layer (BBUL) semiconductor apparatus, comprising:
   a semiconductor die having a backside and a device side;
   a coreless substrate comprising a land side and a die side, wherein the semiconductor die is embedded in the coreless substrate, the backside of the semiconductor die facing the die side of the coreless substrate, and the device side of the semiconductor die facing the land side of the coreless substrate;
   a foundation substrate;
   an array of external conductive contacts disposed on the land side of the coreless substrate, electrically coupling the coreless substrate to the foundation substrate; and
   an epoxy-amine underfill material disposed between the land side of the coreless substrate and the foundation substrate and surrounding the plurality of external conductive contacts, the epoxy-amine underfill having high adhesion and based on a low volatility multi-functional amine species.

23. The BBUL semiconductor apparatus of claim 22, wherein the multi-functional amine species is an ortho-para-bisamine benzyl compound, wherein the ortho-para-bisamine benzyl compound comprises an organic moiety in each of the meta-positions, and, wherein the amine moieties of the ortho-para-bisamine benzyl compound are primary amine moieties.

24. The BBUL semiconductor apparatus of claim 22, wherein the epoxy-amine underfill material is formed from a reaction between a bis-epoxide compound and the multi-functional amine species.

25. The BBUL semiconductor apparatus of claim 22, wherein the epoxy-amine underfill material is adhered to the land side of the coreless substrate and to the foundation substrate by an adhesion promoter.

* * * * *